United States Patent
Bowers et al.

(10) Patent No.: US 10,721,829 B1
(45) Date of Patent: Jul. 21, 2020

(54) REMOVABLE FEET FOR ELECTRONIC DEVICES

(71) Applicant: Microsoft Technology Licensing, LLC, Redmond, WA (US)

(72) Inventors: Scott Douglas Bowers, Woodinville, WA (US); Brooks Hallin, Seattle, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 16/459,125

(22) Filed: Jul. 1, 2019

(51) Int. Cl.
    *H05K 5/02* (2006.01)
    *H05K 5/03* (2006.01)

(52) U.S. Cl.
    CPC ......... *H05K 5/0234* (2013.01); *H05K 5/0217* (2013.01); *H05K 5/03* (2013.01)

(58) Field of Classification Search
    CPC combination set(s) only.
    See application file for complete search history.

(56) References Cited

U.S. PATENT DOCUMENTS

| | | | | |
|---|---|---|---|---|
| 4,696,089 A * | 9/1987 | Gjesdal | ................ | B25B 13/065 29/235 |
| 5,921,516 A * | 7/1999 | Ho | ................ | A47B 91/00 248/206.5 |
| 6,979,778 B2 * | 12/2005 | Xiong | ................ | A47B 91/04 174/158 R |
| 7,697,283 B2 * | 4/2010 | Mathew | ................ | A47B 91/00 248/188 |
| 7,817,418 B2 * | 10/2010 | Bailey | ................ | H05K 5/0234 361/679.59 |
| 7,950,611 B2 * | 5/2011 | Tracy | ................ | H05K 5/0234 248/176.3 |
| 8,154,860 B2 * | 4/2012 | Chen | ................ | F16M 13/00 135/66 |
| 8,300,406 B2 * | 10/2012 | Chen | ................ | G06F 1/1656 248/188.8 |

(Continued)

FOREIGN PATENT DOCUMENTS

| CN | 201349375 Y | 11/2009 |
|---|---|---|
| JP | 2003124641 A | 4/2003 |

OTHER PUBLICATIONS

"Laptop Lower Case Rubber Feet/Foot for MacBook Pro Bottom Case Rubber Feet 13" 15" 17" A1278 A1286 A1297 Rubber Feet", Retrieved From: https://www.amazon.in/Laptop-Lower-Rubber-MacBook-Bottom/dp/B07DC4YYBZ, Retrieved On: May 5, 2019, 3 Pages.

*Primary Examiner* — Lisa Lea-Edmonds
(74) *Attorney, Agent, or Firm* — Holzer Patel Drennan

(57) ABSTRACT

Typical electronic device feet are adhered to a bottom surface of an electronic device housing. However, adhered feet are not generally readily removable and replaceable without also removing and replacing the adhesive, which may be messy and time consuming. Implementations described and claimed herein provide an electronic device with a device housing including an aperture therein, a retaining ring oriented within a seat, the retainer ring and the seat concentric with the aperture, and a device foot oriented within and protruding outward from the aperture. The device foot has a concentric extraction surface and the retaining ring compresses against the concentric extraction surface and secures the device foot in place against the device housing.

19 Claims, 8 Drawing Sheets

(56) References Cited

U.S. PATENT DOCUMENTS

| | | | | |
|---|---|---|---|---|
| 8,345,411 | B2* | 1/2013 | Tseng | G06F 1/181 |
| | | | | 361/679.02 |
| 8,376,557 | B2* | 2/2013 | Su | H05K 5/0204 |
| | | | | 220/254.3 |
| 8,491,067 | B2* | 7/2013 | Chen | H05K 5/0234 |
| | | | | 248/188.8 |
| 8,531,836 | B2* | 9/2013 | Iwamoto | H05K 5/0234 |
| | | | | 248/677 |
| 8,537,546 | B2* | 9/2013 | Shih | H05K 5/0234 |
| | | | | 361/679.59 |
| 8,941,990 | B2* | 1/2015 | Uttermann | H05K 5/0234 |
| | | | | 248/188.8 |
| 8,979,221 | B2* | 3/2015 | Kannler | G06F 1/183 |
| | | | | 312/223.2 |
| 8,985,545 | B2* | 3/2015 | Chiu | H05K 5/0234 |
| | | | | 248/188.8 |
| 9,091,585 | B2* | 7/2015 | Turner | G01G 5/006 |
| 9,377,820 | B2* | 6/2016 | Fu | G06F 1/166 |
| 9,400,526 | B2* | 7/2016 | Casebolt | G06F 1/1656 |
| 9,491,875 | B2* | 11/2016 | Deng | H05K 5/0234 |
| 9,596,774 | B2* | 3/2017 | Dernier | H05K 5/0204 |
| 10,371,312 | B2* | 8/2019 | Majumdar | F16M 11/18 |
| 2011/0090623 | A1* | 4/2011 | Liu | G06F 1/1616 |
| | | | | 361/679.01 |
| 2011/0310536 | A1* | 12/2011 | Uttermann | G06F 1/166 |
| | | | | 361/679.01 |
| 2013/0301193 | A1* | 11/2013 | Abe | H05K 7/00 |
| | | | | 361/679.01 |

* cited by examiner

US 10,721,829 B1

REMOVABLE FEET FOR ELECTRONIC DEVICES

BACKGROUND

Electronic devices are often placed on a work surface during use and expected to remain in a desired position. Relatively small loads caused by a user, or loads caused by the device's operation itself (e.g., vibration) should not cause the device to move across the work surface. As such, feet are often adhered or otherwise attached to bottom surfaces of electronic devices to provide points of contact with the work surface with a high coefficient of friction. Further, the feet are often made of a resiliently elastic material that resists damage thereto. Also, by acting as points of contact with the work surface, the feet protect the remaining bottom surfaces of electronic devices from damage caused by contact with the work surface (e.g., scratches). Still further, the feet offset the remaining bottom surfaces from a work surface, which may aid in thermal management of the electronic devices.

Adhered feet are not generally readily removable and replaceable without also removing and replacing the adhesive, which may be messy and time consuming. Further, over time the feet may become inadvertently dislodged from the electronic device housing and may need to be quickly and easily replaced.

SUMMARY

Implementations described and claimed herein provide an electronic device comprising a device housing including an aperture therein, a retaining ring oriented within a seat, the retainer ring and the seat concentric with the aperture, and a device foot oriented within and protruding outward from the aperture. The device foot has a concentric extraction surface and the retaining ring compresses against the concentric extraction surface and secures the device foot in place against the device housing.

Implementations described and claimed herein further provide a method of installing a device foot on an electronic device comprising providing a device housing including an aperture therein, providing a retaining ring oriented within a seat concentric with the aperture, the seat formed within the device housing, and compressing a device foot through the retaining ring and into the aperture. The retaining ring compresses against a concentric extraction surface of the device foot and secures the device foot in place against the device housing.

Implementations described and claimed herein still further provide a method of installing a device foot on an electronic device comprising providing a device housing including an aperture therein, providing a rigid post affixed within the aperture and protruding outward from the aperture, and providing a resiliently deflectable cap and a retaining ring oriented within a concentric seat within the resiliently deflectable cap. The method further compresses the resiliently deflectable cap onto the rigid post, the retaining ring compressing against a concentric extraction surface of the rigid post and securing the resiliently deflectable cap in place against the device housing.

Other implementations are also described and recited herein. This Summary is provided to introduce a selection of concepts in a simplified form that are further described below in the Detailed Descriptions. This Summary is not intended to identify key features or essential features of the claimed subject matter, nor is it intended to be used to limit the scope of the claimed subject matter.

BRIEF DESCRIPTIONS OF THE DRAWINGS

DETAILED DESCRIPTIONS

Figure 1:
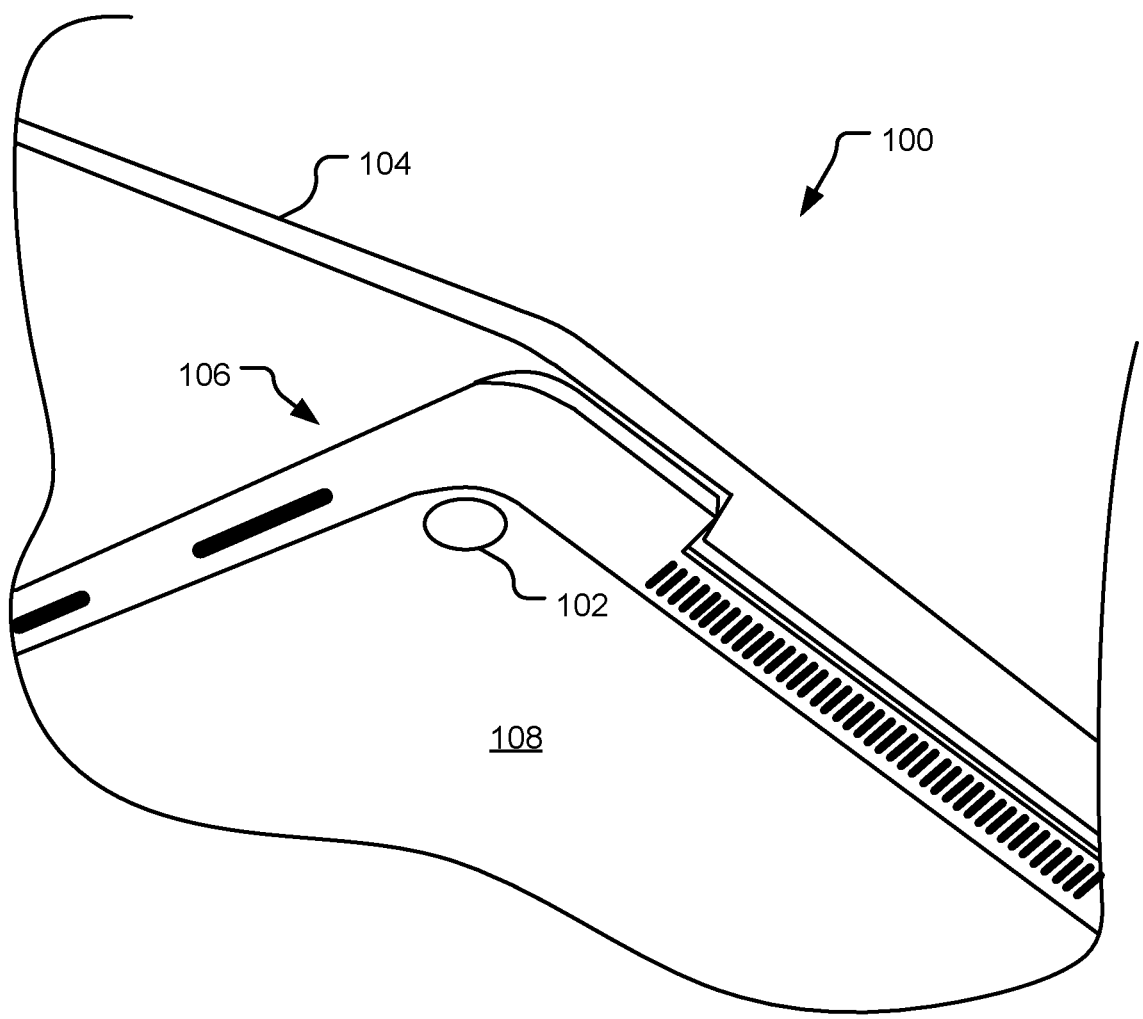
FIG. 1 is a partial bottom perspective view of an example computing device with a removable foot.

FIG. 1 is a partial bottom perspective view of an example computing device 100 with a removable foot 102. The computing device 100 is depicted as a laptop computer, however, other computing devices or electronic devices are contemplated herein. More specifically, the computing device 100 may be a tablet computer, personal computer, gaming device, smart phone, dual-display device, flexible-display device, or any other device that carries out one or more specific sets of arithmetic and/or logical operations. While computing devices are one type of electronic device, the removable foot 102 may be used on other electronic devices (e.g., tabletop appliances, audio/video equipment, computer peripherals, and so on).

The computing device 100 includes a display (or first) portion 104 hingedly connected to a base (or second) portion 106. The base portion 106 includes a base housing 108 (which may also be referred to herein as a bucket, chassis, or case), a portion of which faces downward and forms a surface on which the removable foot 102 is mounted. More specifically, the base housing 108 includes an aperture (not shown) corresponding to the removable foot 102. A portion of the removable foot 102 is oriented within the aperture and the removable foot 102 protrudes outward from the aperture.

While only one removable foot 102 is depicted in FIG. 1, multiple removable feet may be used in a variety of electronic devices. One arrangement is an array of four removable feet, each at a corner of a rectangular base housing of the electronic device 100. In various other implementations, greater or fewer than four removable feet may be used on the electronic device 100, each of which arranged as desired on one or more surfaces of the electronic device that are intended to interface with a work surface. In various implementations, the work surface is a table or desk, but the work surface may also be a floor or any other surface that the electronic device 100 rests against while in use or transport.

Further, while the removable foot 102 of FIG. 1 is depicted with a generally round plan view shape, the removable foot 102 may be any size and shape appropriate to function as described. For example, the removable foot 102 may be rectangular or oval in plan view, while maintaining other features and functionality described herein. In one example implementation, the removable foot 102 may be a relatively long and thin rectangle or oval that extends about a majority of a side of the rectangular base housing of an electronic device. The relatively long and thin removable foot may incorporate multiple portions that extend into multiple corresponding apertures (e.g., aperture 210 and features thereof, including but not limited to retaining ring 218) in a base housing that are also regularly spaced along the majority of the side of the rectangular base housing.

Still further, the removable foot 102 may be made of a variety of materials, however, at least a portion of the removable foot 102 (e.g., the entire removable foot 102, a coating (e.g., a rubber or plastic coating) thereon, or a cap thereon) is resiliently deflectable to interface with the work surface. Example materials include various resiliently deflectable plastics, and synthetic or natural rubbers. Remaining portions of the removable foot 102 may be made of other, potentially more rigid materials (e.g., various metal alloys or rigid plastics).

Additional potential details regarding the removable foot 102, the corresponding aperture, and related features may be found below, discussed with reference to FIGS. 2-8.

Figure 2:
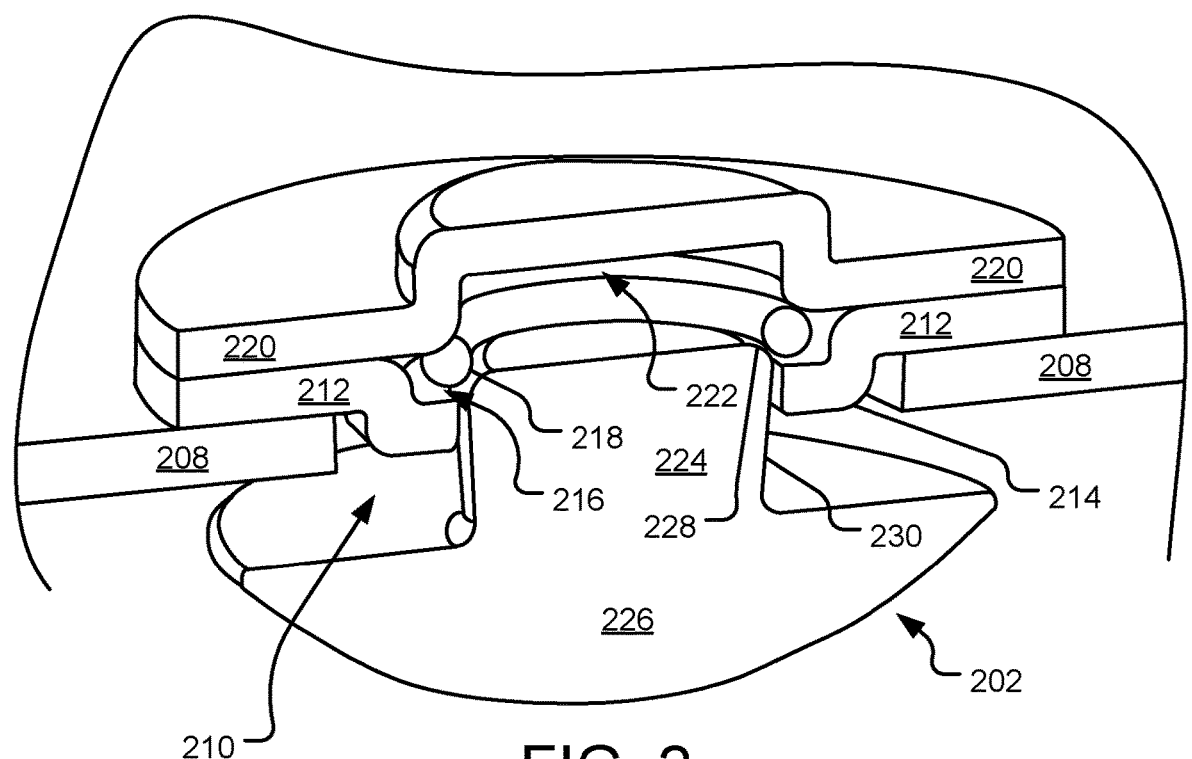
FIG. 2 is a sectional perspective view of an example removable foot prior to being installed onto an electronic device housing.

FIG. 2 is a sectional perspective view of an example removable foot 202 prior to being installed onto an electronic device housing 208 (which may also be referred to herein as a bucket, chassis, or case). The electronic device housing 208 may be that of any computing device or electronic device and forms a generally planar mounting surface for the removable foot 202. An aperture 210 is formed in the housing 208, which receives a portion of the removable foot 202, when installed.

A receiver base 212 is affixed to an interior surface of the device housing 208 and includes an opening concentric with the aperture 210. A receiver lid 220 is affixed to the receiver base 212 and includes a recess 222 concentric with the aperture 210 that receives the removable foot 202 when it is installed onto the electronic device housing 208. The receiver base 212 also includes a recessed portion 214 that in combination with the receiver lid 220 forms a seat 216 concentric with the aperture 210 for retaining ring 218. In some implementations, the receiver lid 220 may include receiver lid aperture (not shown), also concentric with the aperture 210 with a radius smaller than that of the retaining ring 218 so that the receiver lid 220 still functions to secure the retaining ring 218.

The receiver base 212 and the receiver lid 220 are each of a rigid material (e.g., various metal alloys, such as a stamped sheet metal, or rigid plastics that may be molded to the desired size and shape) and are intended to substantially hold their shape as the removable foot 202 is installed onto the electronic device housing 208 and/or removed from the electronic device housing 208. In various implementations, the receiver base 212 and the receiver lid 220 are adhered, welded, soldered, screwed, riveted or otherwise fixedly attached to the electronic device housing 208, as shown and described herein.

The removable foot 202 is generally mushroom-shaped in the depicted profile sectional view, with a post 224 to be secured within the aperture 210 and a cap 226 protruding from the aperture 210 when the removable foot 202 is installed onto the electronic device housing 208. The removable foot 202 includes a rounded (chamfered or filleted) insertion surface 228, as well as an angled extraction surface 230, both of which are concentric with the aperture 210. In some implementations, the housing 208 includes a recess (not shown) concentric with the aperture 210 that accommodates an outer diameter of the cap 226 and permits the cap 226 to protrude out of the recess. The recess may further act to secure the removable foot 202 in place on the electronic device housing 208. In some implementations, the recess may include an adhesive that aids in securing the removable foot 202 in place on the electronic device housing 208.

In various implementations, the removable foot 202 is a monolithic resiliently deflectable structure, though it has separate functional portions (e.g., the post 224 and the cap 226). In other implementations, the post 224 and the cap 226 may be physically separate components joined together to form the removable foot 202. The removable foot 202 may be made of a variety of materials, however, at least a portion of the removable foot 202 (e.g., the entire removable foot 202, a coating thereon, or the cap 226) is resiliently deflectable to interface with the work surface. In various implementation, the cap 226 may be concentric with the post 224 (as shown) or the cap 226 may have a shape that is non-concentric with the post 224.

The retaining ring 218 resiliently deflects when the removable foot 202 is installed onto the electronic device housing 208 and compressively holds the removable foot 202 in place once installed onto the electronic device housing 208. More specifically, as the removable foot 202 is pressed into the aperture 210, the retaining ring 218 deflects around the insertion surface 228 and compresses against the extraction surface 230 to secure the device foot 202 in place against the device housing 208. In some implementations, the retaining ring 218 may deflect during use of the electronic device to absorb shear loads, reducing a likelihood that the device foot 202 is inadvertently removed.

In various implementations, the retaining ring 218 is continuous or split, and may be made of a metal alloy (such as spring steel or music wire), a rubber, or a plastic. Two specific example retaining rings are a split metal ring and a rubber (natural or synthetic) o-ring. In the case of the split metal ring, the metal is sufficiently resiliently deflectable in primarily bending load under expected load conditions imposed by the removable foot 202. In the case of the rubber o-ring, the rubber is sufficiently resiliently deflectable in primarily tensile load under expected load conditions imposed by the removable foot 202.

In other implementations, the described features of the receiver base 212 are machined or otherwise directly incorporated into the housing 208. Thus, the receiver base 212 is omitted and the receiver lid 220 is attached directly to the housing 208, forming the seat 216 for the retaining ring 218.

In some implementations, an adhesive is added to the removable foot 202 where it interfaces with the housing 208 (or other described components) to aid in secure attachment of the removable foot 202 to the device housing 208. Additional potential details regarding the removable foot 202, the corresponding aperture 210, the receiver base 212, the receiver lid 220, the retaining ring 218, and related features may be found elsewhere herein, discussed with reference to FIGS. 1 and 3-8.

Figure 3:
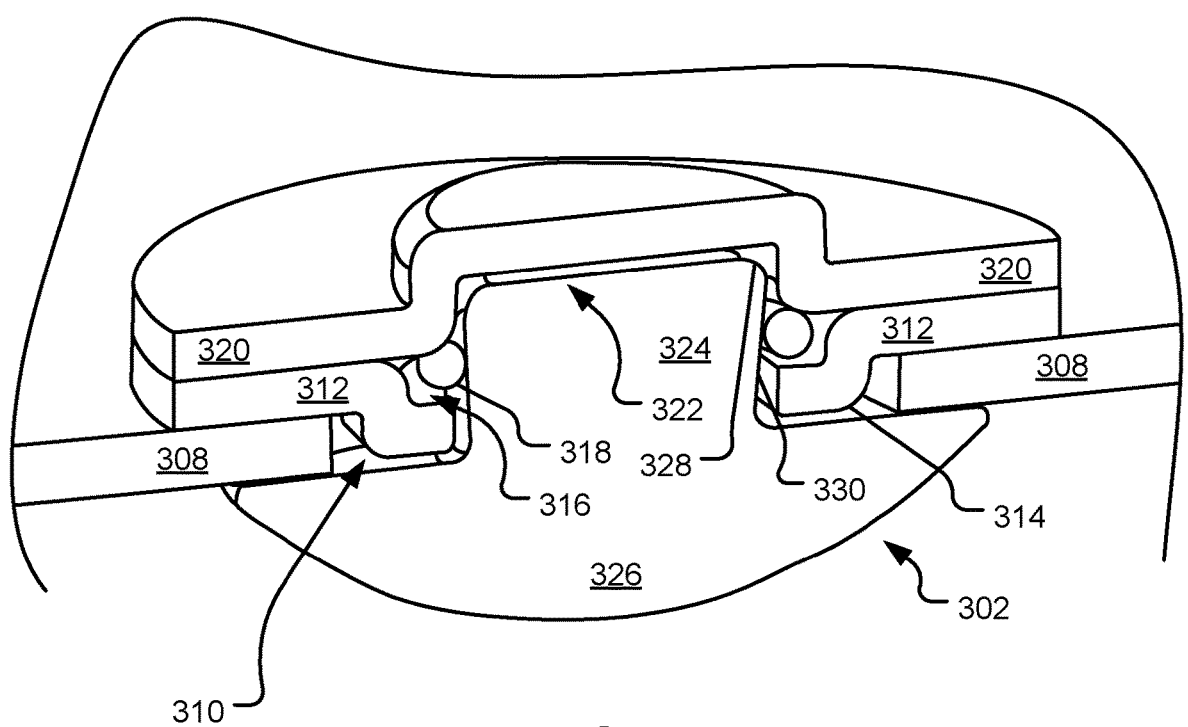
FIG. 3 is a sectional perspective view of an example removable foot installed onto an electronic device housing.

FIG. 3 is a sectional perspective view of an example removable foot 302 installed onto an electronic device housing 308. The electronic device housing 308 may be that of any computing device or electronic device and forms a generally planar mounting surface for the removable foot 302. An aperture 310 is formed in the housing 308, which receives a portion of the removable foot 302, as shown.

A receiver base 312 is affixed to an interior surface of the device housing 308 and includes an opening concentric with the aperture 310. A receiver lid 320 is affixed to the receiver base 312 and includes a recess 322 concentric with the aperture 310 that receives the removable foot 302. The receiver base 312 also includes a recessed portion 314 that in combination with the receiver lid 320 forms a seat 316 concentric with the aperture 310 for retaining ring 318. In some implementations, the receiver lid 320 may include receiver lid aperture (not shown), also concentric with the aperture 310 with a radius smaller than that of the retaining ring 318 so that the receiver lid 320 still functions to secure the retaining ring 318. The receiver base 312 and the receiver lid 320 are each of a rigid material and are intended to substantially hold their shape as the removable foot 302 is installed onto the electronic device housing 308 (as shown) and/or removed from the electronic device housing 308.

The removable foot 302 is generally mushroom-shaped in the depicted profile sectional view, with a post 324 secured within the aperture 310 and a cap 326 protruding from the aperture 310. The removable foot 302 includes a rounded insertion surface 328, as well as an angled extraction surface 330, both of which are concentric with the aperture 310. In various implementation, the cap 326 may be concentric with the post 324 (as shown) or the cap 326 may have a shape that is non-concentric with the post 324. In some implementations, the housing 308 includes a recess (not shown) concentric with the aperture 310 that accommodates an outer diameter of the cap 326 and permits the cap 326 to protrude out of the recess. The recess may further act to secure the removable foot 302 in place on the electronic device housing 308.

The retaining ring 318 resiliently deflects when the removable foot 302 is installed onto the electronic device housing 308 and compressively holds the removable foot 302 in place once installed onto the electronic device housing 308. More specifically, as the removable foot 302 is pressed into the aperture 310, the retaining ring 318 deflects around the insertion surface 328 and compresses against the extraction surface 330 to secure the device foot 302 in place against the device housing 308. As the extraction surface 330 is angled toward a center of the device foot 302, the concentric compressive force exerted by the retaining ring 318 onto the post 324 of the device foot 302 has a component directed upward into the housing 308, as well as a radially inward component. The component directed upward into the housing 308 holds the cap 326 securely against the device housing 308.

Additional potential details regarding the removable foot 302, the corresponding aperture 306, the receiver base 312, the receiver lid 320, the retaining ring 318, and related features may be found elsewhere herein, discussed with reference to FIGS. 1-2 and 4-8.

Figure 4:
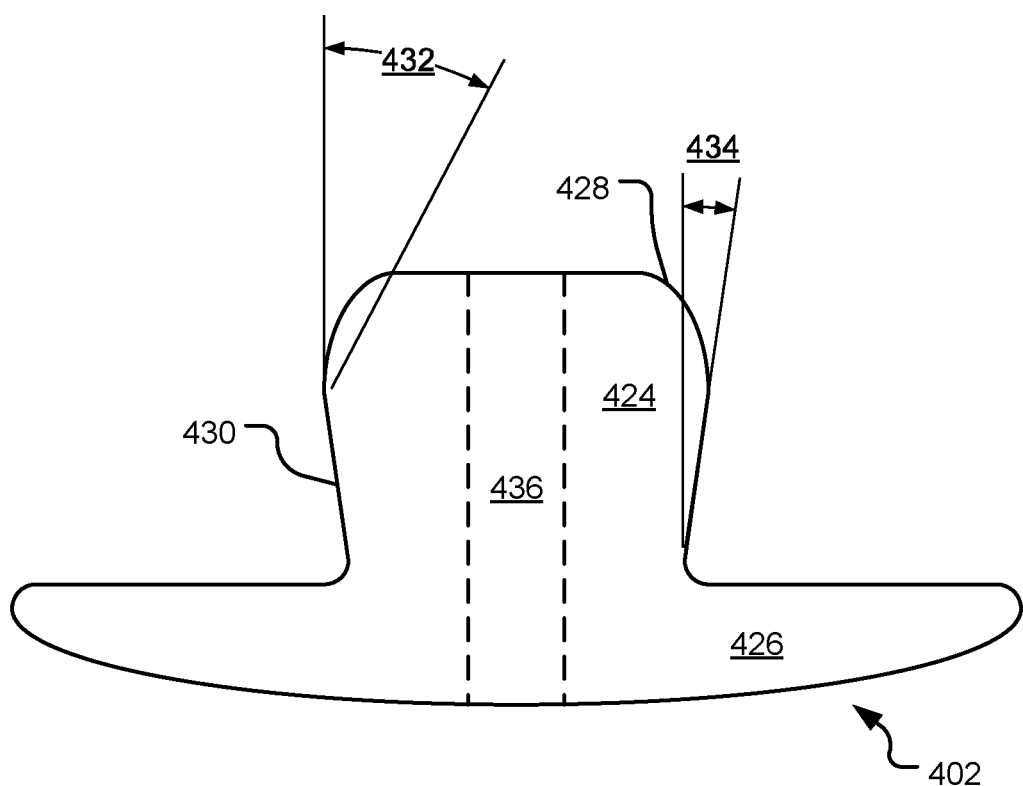
FIG. 4 is a sectional elevation view of an example removable foot for an electronic device.

FIG. 4 is a sectional elevation view of an example removable foot 402 for an electronic device (not shown). The removable foot 402 is generally mushroom-shaped in the depicted profile sectional view, though other shapes are contemplated herein. The foot 402 includes a post 424 to be secured within an aperture (not shown) and a cap 426 to protrude from the aperture when the removable foot 402 is installed onto an electronic device housing (not shown). In various implementation, the cap 426 may be concentric with the post 424 (as shown) or the cap 426 may have a shape that is non-concentric with the post 424. The removable foot 402 includes a rounded (chamfered or filleted) insertion surface 428, as well as an angled extraction surface 430, both of which are concentric with the perimeter the removable foot 402.

The rounded insertion surface 428 aids in centering the removable foot 402 within the aperture prior to insertion, as well as aids in deflecting an associated retaining ring (not shown) as the removable foot 402 is inserted into the aperture. The rounded insertion surface 428 has an associated insertion angle 432 that may range from 20-40 degrees, for example. In a filleted implementation, the insertion surface 428 may be characterized by a radius in addition to or in lieu of the insertion angle 432. The angled extraction surface 430 permits the associated retaining ring to compressively hold the removable foot 402 in place once installed within the aperture. The angled extraction surface 430 has an associated extraction angle 434 toward a center of the removable foot 402 that may range from 5-20 degrees, for example.

In an example implementation, the post 424 has a 1-2 mm radius at its widest point, while the radius of the cap 426 at its widest point is approximately 2 to 3 times that of the radius of the post 424. Further, the extraction angle 434 may be set at approximately 15 degrees, while the radius of the insertion surface 428 is approximately 0.5 of the radius of the post 424 at its widest point. Approximately means=/−10% herein.

In some implementations, the removable foot 402 may include a concentric foot aperture 436 therethrough (illustrated by dashed lines). The foot aperture 436 may permit a user access to a screw holding the chassis of the electronic device together (or other component(s) electronic device together), or a reset or other hidden button in the chassis, without first removing the foot 402. In some implementations, the foot aperture 436 houses the screw, button, or other feature, but the removable foot 402 must be removed to access the screw, button, or other feature. In such implementations, space within the removable foot 402 is utilized for the screw, button, or other feature rather than space within the electronic device, which may not be available (or is only available at a premium).

In various implementations, the removable foot 402 is a monolithic resiliently deflectable structure, though it has separate functional portions (e.g., the post 424 and the cap 426). In other implementations, the post 424 and the cap 426 may be physically separate components joined together to form the removable foot 402. The removable foot 402 may be made of a variety of materials, however, at least a portion of the removable foot 402 (e.g., the entire removable foot 402, a coating thereon, or the cap 426) is resiliently deflectable to interface with a work surface that the electronic device is set upon.

Additional potential details regarding the removable foot 402 and related features may be found elsewhere herein, discussed with reference to FIGS. 1-3 and 5-8.

Figure 5:
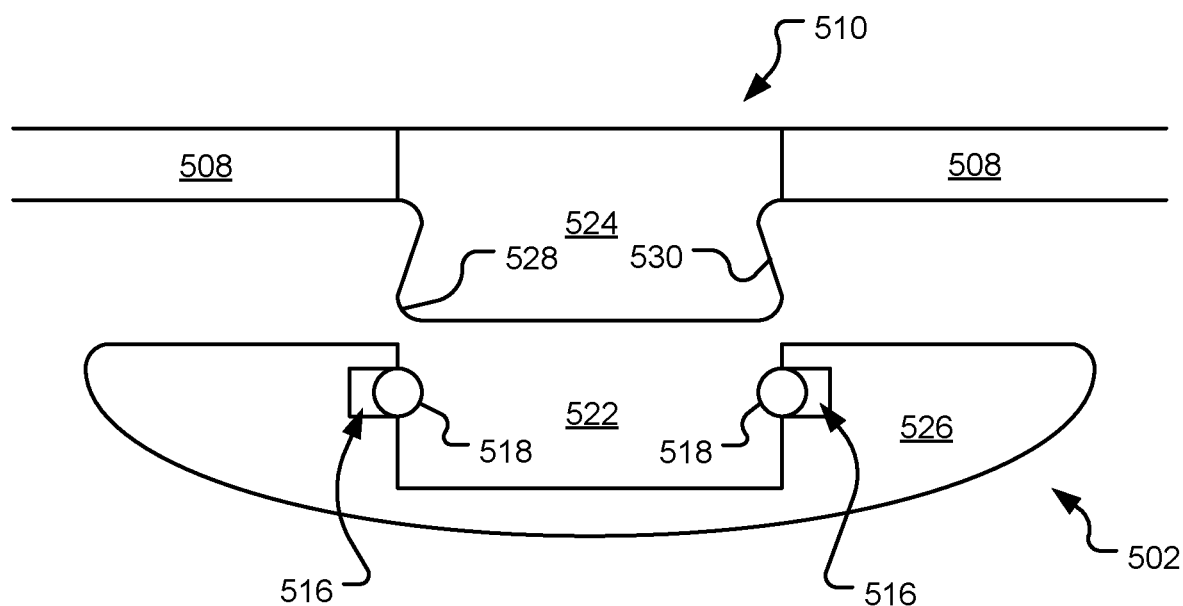
FIG. 5 is a sectional elevation view of an example resiliently deflectable cap prior to being installed onto a rigid post forming a removable foot for an electronic device.

FIG. 5 is a sectional elevation view of an example resiliently deflectable cap 526 prior to being installed onto a rigid post 524 forming a removable foot 502 for an electronic device (not shown). An associated electronic device housing 508 may be that of any computing device or electronic device and forms a generally planar mounting surface for the removable foot 502.

An aperture 510 is formed in the housing 508, which receives the rigid post 524 portion of the removable foot 502. In various implementations, the rigid post 524 may be screwed, pressed, welded, glued, soldered, or otherwise fixedly secured within the aperture 510. In some implementations, the rigid post 524 is machined or otherwise directly incorporated into the housing 508 and may be contiguous with the housing 508. The post 524 is of a rigid material (e.g., various metal alloys, such as stamped sheet metal, or rigid plastics that may be molded to the desired size and shape) and is intended to substantially hold its shape as the cap 526 is installed onto the rigid post 524 and/or removed from the rigid post 524. In various implementation, the cap 526 may be concentric with the post 524 (as shown) or the cap 526 may have a shape that is non-concentric with the post 524. In some implementations, the housing 508 includes a recess (not shown) concentric with the aperture 510 that accommodates an outer diameter of the cap 526 and permits the cap 526 to protrude out of the recess. The recess may further act to secure the removable foot 502 in place on the electronic device housing 508.

The cap 526 includes a recess 522 concentric with the aperture 510 that receives the post 524. The cap 526 further includes a seat 516 concentric with the recess 522 for retaining ring 518. The cap 526 may be made of a variety of resiliently deflectable materials. The post 524 is secured within the aperture 510 and the cap 526 is selectively attached thereon. The post 524 includes a rounded (chamfered or filleted) insertion surface 528, as well as an angled extraction surface 530, both of which are concentric with the aperture 510.

The retaining ring 518 resiliently deflects into the seat 516 when the cap 526 is installed onto the post 524 and compressively holds the cap 526 in place on the post 524 once installed. More specifically, as the cap 526 is pressed onto the post 524, the retaining ring 518 deflects around the insertion surface 528 and compresses against the extraction surface 530 to secure the device foot 502 in place against the device housing 508. In some implementations, the retaining ring 518 may deflect during use of the electronic device to absorb shear loads, reducing a likelihood that the device foot 502 is inadvertently removed. In various implementations, the retaining ring 518 is continuous or split, and may be made of a metal alloy (such as spring steel or music wire), a rubber, or a plastic.

As compared to the implementations of FIGS. 2 and 3, no portion of the removable foot 502 and its supporting structure extends into the electronic device housing 508 beyond the aperture 510. This may be helpful if no space is available within the housing 508. In some implementations, an adhesive is added to the removable foot 502 where it interfaces with the housing 508 (or other described components) to aid in secure attachment of the removable foot 502 to the device housing 508. Additional potential details regarding the removable foot 502, the corresponding aperture 510, the retaining ring 518, and related features may be found elsewhere herein, discussed with reference to FIGS. 1-4 and 6-8.

Figure 6:
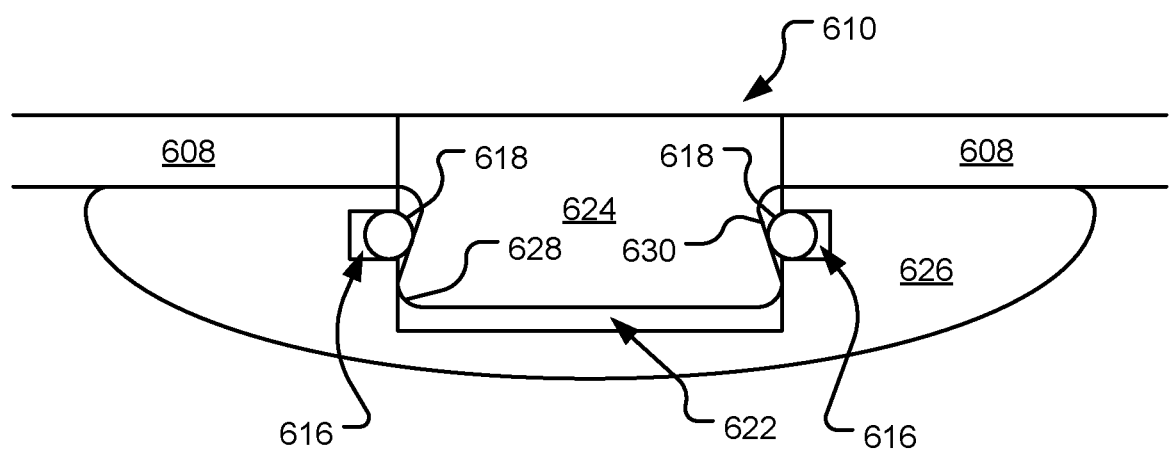
FIG. 6 is a sectional elevation view of an example resiliently deflectable cap installed onto a rigid post forming a removable foot for an electronic device.

FIG. 6 is a sectional elevation view of an example resiliently deflectable cap 626 installed onto a rigid post 624 forming a removable foot 602 for an electronic device (not shown). An associated electronic device housing 608 may be that of any computing device or electronic device and forms a generally planar mounting surface for the removable foot 602.

An aperture 610 is formed in the housing 608, which receives the rigid post 624 portion of the removable foot 602. In various implementations, the rigid post 624 may be screwed, pressed, welded, glued, soldered, or otherwise fixedly secured within the aperture 610. In some implementations, the rigid post 624 is machined or otherwise directly incorporated into the housing 608 and may be contiguous with the housing 608. The post 624 is of a rigid material and is intended to substantially hold its shape as the cap 626 is installed onto the rigid post 624 and/or removed from the rigid post 624. In various implementation, the cap 626 may be concentric with the post 624 (as shown) or the cap 626 may have a shape that is non-concentric with the post 624. In some implementations, the housing 608 includes a recess (not shown) concentric with the aperture 610 that accommodates an outer diameter of the cap 626 and permits the cap 626 to protrude out of the recess. The recess may further act to secure the removable foot 602 in place on the electronic device housing 608.

The cap 626 includes a recess 622 concentric with the aperture 610 that receives the post 624. The cap 626 further includes a seat 616 concentric with the aperture 610 for retaining ring 618. The cap 626 may be made of a variety of resiliently deflectable materials. The post 624 is secured within the aperture 610 and the cap 626 is selectively attached thereon. The post 624 includes a rounded (chamfered or filleted) insertion surface 628, as well as an angled extraction surface 630, both of which concentric with the aperture 610.

The retaining ring 618 resiliently deflects into the seat 616 when the cap 626 is installed onto the post 624 and compressively holds the cap 626 in place on the post 624, as shown. More specifically, as the cap 626 is pressed onto the post 624, the retaining ring 618 deflects around the insertion surface 628 and compresses against the extraction surface 630 to secure the device foot 602 in place against the device housing 608.

As compared to the implementations of FIGS. 2 and 3, no portion of the removable foot 602 and its supporting structure extends into the electronic device housing 608 beyond the aperture 610. This may be helpful if no space is available within the housing 608. Additional potential details regarding the removable foot 602, the corresponding aperture 610, the retaining ring 618, and related features may be found elsewhere herein, discussed with reference to FIGS. 1-5 and 7-8.

Figure 7:
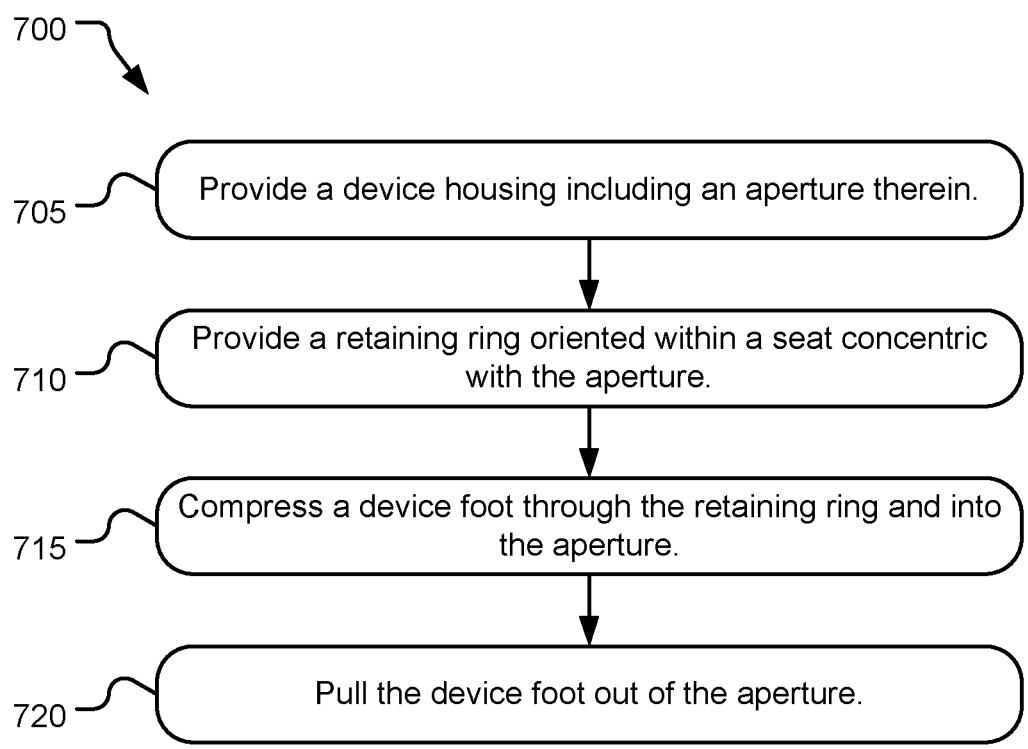
FIG. 7 illustrates example operations for using a removable foot for an electronic device.

FIG. 7 illustrates example operations 700 for using a removable foot for an electronic device. A first providing operation 705 provides a device housing including an aperture therein. The device housing is that of any computing device or electronic device and the aperture is intended to secure a removable device foot therein. A second providing operation 710 provides a retaining ring oriented within a seat concentric with the aperture. The seat is formed within the device housing, in some implementations using one or both of a receiver base affixed to the device housing and a receiver lid affixed to the receiver base.

A compressing operation 715 compresses a device foot through the retaining ring and into the aperture. The retaining ring compresses against a concentric extraction surface of the device foot and secures the device foot in place against the device housing. In various implementations, the device foot includes a rounded (chamfered or filleted) insertion surface, as well as an angled extraction surface, both of which are concentric with the aperture.

The retaining ring resiliently deflects when the device foot is installed onto the electronic device housing and compressively holds the device foot in place once installed onto the electronic device housing. More specifically, as the device foot is pressed into the aperture, the retaining ring deflects around the insertion surface and compresses against the extraction surface to secure the device foot in place against the device housing.

A pulling operation 720 pulls the device foot out of the aperture. To achieve the pulling operation 720, a pulling force exerted on the device foot exceeds a retaining compression force exerted by the retaining ring on the device foot. The pulling operation 720 may be accomplished by a user intentionally, or in some implementations, inadvertently.

Figure 8:
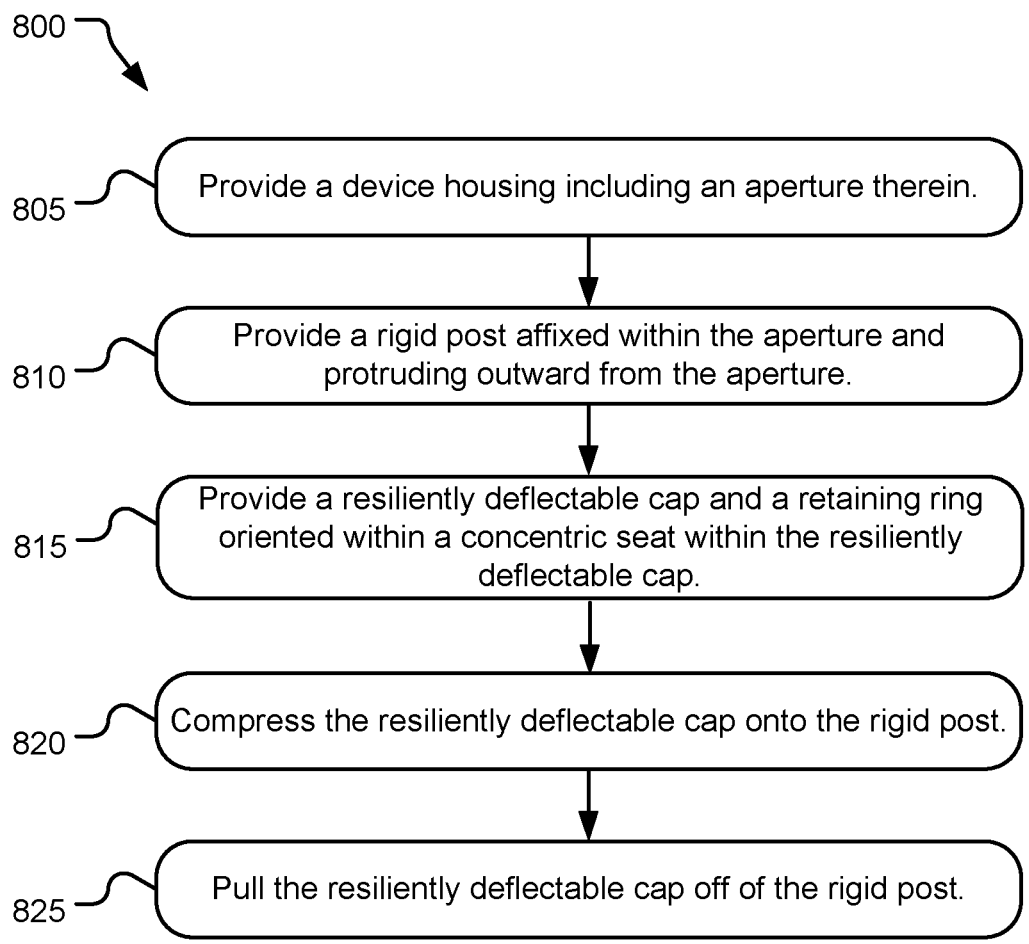
FIG. 8 illustrates example operations for using another removable foot for an electronic device.

FIG. 8 illustrates example operations 800 for using another removable foot for an electronic device. A first providing operation 805 provides a device housing including an aperture therein. The device housing is that of any computing device or electronic device and the aperture is intended to secure a removable device foot therein. A second providing operation 810 provides a rigid post affixed within the aperture and protruding outward from the aperture. The rigid post forms a first part of the removable foot. A third providing operation 815 provides a resiliently deflectable cap and a retaining ring oriented within a concentric seat within the resiliently deflectable cap. The resiliently deflectable cap forms a second part of the removable foot.

A compressing operation 820 compresses the resiliently deflectable cap onto the rigid post. The retaining ring compresses against a concentric extraction surface of the rigid post and secures the resiliently deflectable cap in place against the device housing. In various implementations, the rigid post includes a rounded (chamfered or filleted) insertion surface, as well as an angled extraction surface, both of which are concentric with the aperture.

The retaining ring resiliently deflects when the resiliently deflectable cap is installed onto the rigid post and compressively holds the device foot in place once installed onto the electronic device housing. More specifically, as the resiliently deflectable cap is pressed onto the rigid post, the retaining ring deflects around the insertion surface and compresses against the extraction surface to secure the resiliently deflectable cap in place against the device housing.

A pulling operation 825 pulls the resiliently deflectable cap off of the rigid post. To achieve the pulling operation 825, a pulling force exerted on the resiliently deflectable cap exceeds a retaining compression force exerted by the retaining ring on the rigid post. The pulling operation 825 may be accomplished by a user intentionally, or in some implementations, inadvertently.

In various implementations, the specific geometry of the device foot, including but not limited to the angle and/or radii of the rounded (chamfered or filleted) insertion surface and the angled extraction surface define both an insertion force and an extraction force for installing and removing the device foot, respectively. In an example implementation, the both forces are between 5 and 25 Newtons. In some implementations, the insertion force and an extraction force are optimized to provide a user a tactical and/or auditory sensation and feedback when installing and/or removing the device foot (e.g., a snap or click indicating that the device foot has been placed properly, and/or indicating that the device foot has been removed).

The operations making up the embodiments of the invention described herein are referred to variously as operations, steps, objects, or modules. Furthermore, the operations may be performed in any order, adding or omitting operations as desired, unless explicitly claimed otherwise or a specific order is inherently necessitated by the claim language.

An example electronic device according to the presently disclosed technology comprises a device housing including an aperture therein, a retaining ring oriented within a seat, the retainer ring and the seat concentric with the aperture, and a device foot oriented within and protruding outward from the aperture, the device foot having a concentric extraction surface, the retaining ring to compress against the concentric extraction surface and secure the device foot in place against the device housing.

Another example electronic device according to the presently disclosed technology further comprises a receiver base affixed to an interior surface of the device housing, the receiver base concentric with the aperture, and a receiver lid affixed to the receiver base within the device housing, the receiver base and the receiver lid in combination forming the seat for the retaining ring.

Another example electronic device according to the presently disclosed technology further comprises a receiver lid affixed to an interior surface of the device housing, the receiver lid concentric with the aperture, the device housing and the receiver lid in combination forming the seat for the retaining ring.

In another example electronic device according to the presently disclosed technology, the device foot includes a rigid post and a resiliently deflectable cap, the rigid post affixed within the aperture and protruding outward from the aperture, the resiliently deflectable cap including the seat for the retaining ring, and the retaining ring securing the resiliently deflectable cap in place against the device housing.

In another example electronic device according to the presently disclosed technology, the resiliently deflectable cap is removable from the rigid post and replaceable onto the rigid post.

In another example electronic device according to the presently disclosed technology, the device foot is removable from the aperture and replaceable within the aperture.

In another example electronic device according to the presently disclosed technology, the device foot includes a rounded insertion surface concentric with the aperture.

In another example electronic device according to the presently disclosed technology, the concentric extraction surface is angled toward a center of the device foot.

In another example electronic device according to the presently disclosed technology, the device foot is a monolithic resiliently deflectable structure.

In another example electronic device according to the presently disclosed technology, the retainer ring is one of a split metal ring and an o-ring.

In another example electronic device according to the presently disclosed technology, the device foot includes a concentric foot aperture therein.

An example method of installing a device foot on an electronic device according to the presently disclosed technology comprises providing a device housing including an aperture therein, providing a retaining ring oriented within a seat concentric with the aperture, the seat formed within the device housing, and compressing a device foot through the retaining ring and into the aperture, the retaining ring compressing against a concentric extraction surface of the device foot and securing the device foot in place against the device housing.

Another example method according to the presently disclosed technology further comprises pulling the device foot out of the aperture, wherein a pulling force exerted on the device foot exceeds a retaining compression force exerted by the retaining ring on the device foot.

In another example method according to the presently disclosed technology, the device foot includes a rounded insertion surface concentric with the aperture.

In another example method according to the presently disclosed technology, the device foot is a monolithic resiliently deflectable structure.

In another example method according to the presently disclosed technology, the retainer ring is one of a split metal ring and an o-ring.

An example method of installing a device foot on an electronic device according to the presently disclosed technology comprises providing a device housing including an aperture therein, providing a rigid post affixed within the aperture and protruding outward from the aperture, providing a resiliently deflectable cap and a retaining ring oriented within a concentric seat within the resiliently deflectable cap, and compressing the resiliently deflectable cap onto the rigid post, the retaining ring compressing against a concentric extraction surface of the rigid post and securing the resiliently deflectable cap in place against the device housing.

Another example method according to the presently disclosed technology further comprises pulling the resiliently deflectable cap off of the rigid post, wherein a pulling force exerted on the resiliently deflectable cap exceeds a retaining compression force exerted by the retaining ring on the rigid post.

In another example method according to the presently disclosed technology, the device foot includes a rounded insertion surface concentric with the aperture.

In another example method according to the presently disclosed technology, the retainer ring is one of a split metal ring and an o-ring.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. An electronic device comprising:
   a device housing including an aperture therein;
   a retaining ring oriented within a seat, the retainer ring and the seat concentric with the aperture; and
   a device foot oriented within and protruding outward from the aperture, the device foot having a concentric extraction surface angled toward a center of the device foot while being positioned within the aperture and compressed by the retaining ring, the retaining ring securing the device foot in place against the device housing.

2. The electronic device of claim 1, further comprising:
   a receiver base affixed to an interior surface of the device housing, the receiver base concentric with the aperture; and
   a receiver lid affixed to the receiver base within the device housing, the receiver base and the receiver lid in combination forming the seat for the retaining ring.

3. The electronic device of claim 1, further comprising:
   a receiver lid affixed to an interior surface of the device housing, the receiver lid concentric with the aperture, the device housing and the receiver lid in combination forming the seat for the retaining ring.

4. The electronic device of claim 1, wherein the device foot includes a rigid post and a resiliently deflectable cap, the rigid post affixed within the aperture and protruding outward from the aperture, the resiliently deflectable cap including the seat for the retaining ring, and the retaining ring securing the resiliently deflectable cap in place against the device housing.

5. The electronic device of claim 4, wherein the resiliently deflectable cap is removable from the rigid post and replaceable onto the rigid post.

6. The electronic device of claim 1, wherein the device foot is removable from the aperture and replaceable within the aperture.

7. The electronic device of claim 1, wherein the device foot includes a rounded insertion surface concentric with the aperture.

8. The electronic device of claim 1, wherein the device foot is a monolithic resiliently deflectable structure.

9. The electronic device of claim 1, wherein the retainer ring is one of a split metal ring and an o-ring.

10. The electronic device of claim 1, wherein the device foot includes a concentric foot aperture therein.

11. A method of installing a device foot on an electronic device comprising:
    providing a device housing including an aperture therein;
    providing a retaining ring oriented within a seat concentric with the aperture, the seat formed within the device housing; and
    compressing a device foot through the retaining ring and into the aperture, the retaining ring compressing against a concentric extraction surface of the device foot and securing the device foot in place against the device housing, the concentric extraction surface being angled toward a center of the device foot while positioned within the aperture and compressed by the retaining ring.

12. The method of claim 11, further comprising:
    pulling the device foot out of the aperture, wherein a pulling force exerted on the device foot exceeds a retaining compression force exerted by the retaining ring on the device foot.

13. The method of claim 11, wherein the device foot includes a rounded insertion surface concentric with the aperture.

14. The method of claim 11, wherein the device foot is a monolithic resiliently deflectable structure.

15. The method of claim 11, wherein the retainer ring is one of a split metal ring and an o-ring.

16. A method of installing a device foot on an electronic device comprising:
    providing a device housing including an aperture therein;
    providing a rigid post affixed within the aperture and protruding outward from the aperture;
    providing a resiliently deflectable cap and a retaining ring oriented within a concentric seat within the resiliently deflectable cap; and
    compressing the resiliently deflectable cap onto the rigid post, the retaining ring compressing against a concentric extraction surface of the rigid post and securing the resiliently deflectable cap in place against the device housing, the concentric extraction surface of the rigid post being angled toward a center of the rigid post while affixed within the aperture and compressed by the retaining ring.

17. The method of claim 16, further comprising:
    pulling the resiliently deflectable cap off of the rigid post, wherein a pulling force exerted on the resiliently deflectable cap exceeds a retaining compression force exerted by the retaining ring on the rigid post.

18. The method of claim 16, wherein the device foot includes a rounded insertion surface concentric with the aperture.

19. The method of claim 16, wherein the retainer ring is one of a split metal ring and an o-ring.

* * * * *